(12) United States Patent
Chen et al.

(10) Patent No.: US 8,146,048 B2
(45) Date of Patent: Mar. 27, 2012

(54) SYSTEM AND METHOD FOR REMOVING T-POINT ELEMENTS WITH UNUSED STUBS FROM A PCB LAYOUT DESIGN

(75) Inventors: Han-Long Chen, Shenzhen (CN); Chia-Nan Pai, Taipei Hsien (TW); Shou-Kuo Hsu, Taipei Hsien (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 249 days.

(21) Appl. No.: 12/699,839

(22) Filed: Feb. 3, 2010

(65) Prior Publication Data
US 2011/0055796 A1 Mar. 3, 2011

(30) Foreign Application Priority Data
Aug. 26, 2009 (CN) .......................... 2009 1 0306101

(51) Int. Cl.
*G06F 17/50* (2006.01)

(52) U.S. Cl. .......................... 716/137; 716/132; 716/139
(58) Field of Classification Search .................. 716/132, 716/137, 139
See application file for complete search history.

(56) References Cited

U.S. PATENT DOCUMENTS

| 3,158,421 A | * | 11/1964 | Hasenauer, Jr | ............... 439/493 |
| 4,075,708 A | * | 2/1978 | Chen | ................................ 365/2 |
| 2003/0200346 A1 | * | 10/2003 | Amirtharajah et al. | ....... 709/253 |

* cited by examiner

*Primary Examiner* — Sun Lin
(74) *Attorney, Agent, or Firm* — Altis Law Group, Inc.

(57) ABSTRACT

A system and method for removing T-point elements with unused stubs from a printed circuit board (PCB) layout design obtains each signal line including one or more T-point elements in the PCB layout design, divides the obtained signal line into a plurality of lines according to the one or more T-point elements with unused stubs, and obtains properties of each of the plurality of lines. The system and method further deletes the original layout of the signal line and reconnects the plurality of lines according to the properties of each of the plurality of lines to generate a reconnected signal line, and outputs the reconnected signal line on a display device.

15 Claims, 6 Drawing Sheets

Before removing

After removing

Before removing

After removing

SYSTEM AND METHOD FOR REMOVING T-POINT ELEMENTS WITH UNUSED STUBS FROM A PCB LAYOUT DESIGN

BACKGROUND

1. Technical Field

Embodiments of the present disclosure relate to printed circuit board (PCB) layout technology, and particularly to a system and a method for removing T-point elements with unused stubs from a PCB layout design.

2. Description of Related Art

PCB layout is an important phase in a manufacturing process of a PCB, and is closely related to product quality. In some PCB layout software (e.g., Cadence software), during layout design of the PCB, if two different kinds of parts are to be installed on the PCB, a T-point element is automatically used by the software to connect the different parts together. However, T-point elements work best for connecting three parts together (refer to FIG. 1). If only two parts are connected, then one stub of the T-point element remains unused (e.g., T-point elements 1, 2, and 3 in FIG. 2). Once layout is complete, a simulation of the designed PCB in use needs to be run. Unfortunately, any T-point elements with an unused stub can adversely effect the simulation, thus influencing results of signal transmission of the PCB simulation.

Currently, the T-point elements with unused stubs may only be removed manually and replaced with a more suitable connection, which is inconvenient and time consuming, particularly if there are a large number of such T-point elements.

DETAILED DESCRIPTION

All of the processes described below may be embodied in, and fully automated via, functional code modules executed by one or more general purpose computers or processors. The code modules may be stored in any type of readable medium or other storage device. Some or all of the methods may alternatively be embodied in specialized hardware. Depending on the embodiment, the readable medium may be a hard disk drive, a compact disc, a digital video disc, or a tape drive.

Figure 3:
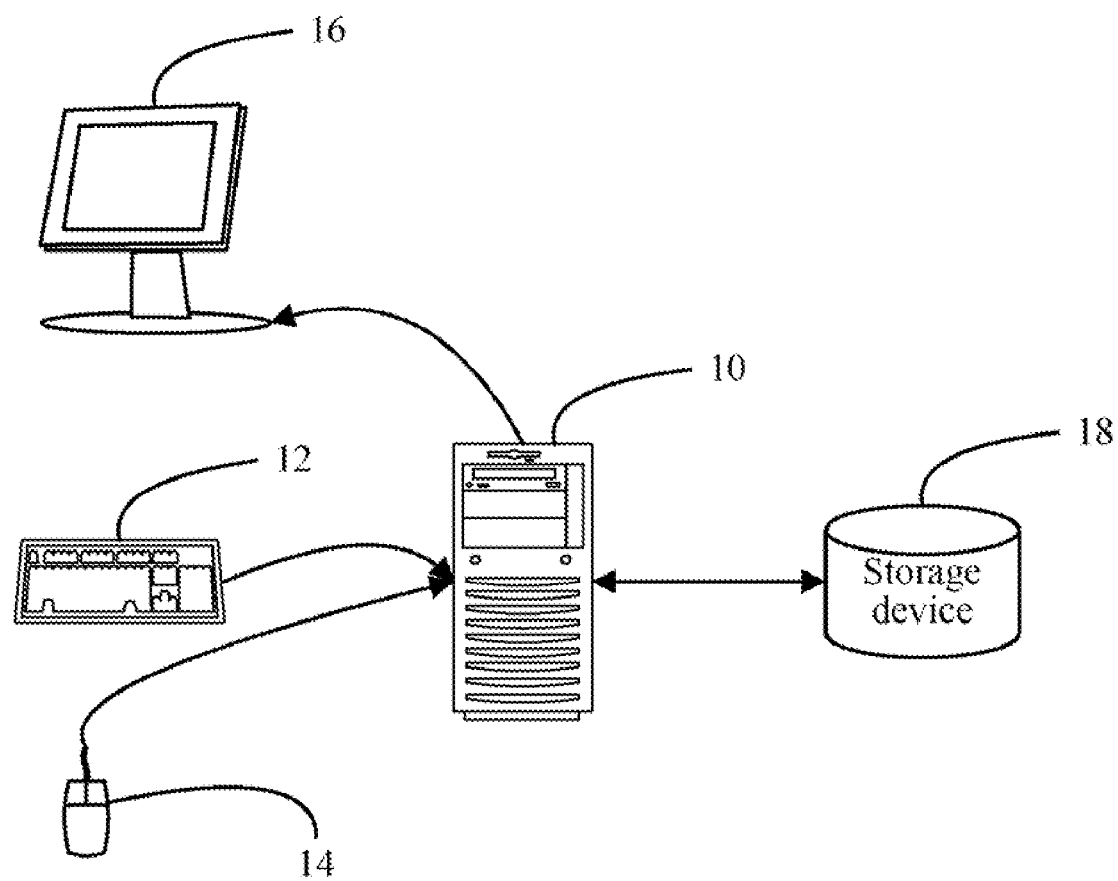
FIG. 3 is a schematic diagram of one embodiment of a system for removing T-point elements with unused stubs from a PCB layout design using software of a computer.

FIG. 3 is a schematic diagram of one embodiment of a system for removing T-point elements with unused stubs from a PCB layout design using software of a computer 10.

In one embodiment, the computer 10 is electronically connected to a display device 16, input devices (e.g., a keyboard 12 and a mouse 14), and a storage device 18. The display device 16 may be a liquid crystal display (LCD) or a cathode ray tube (CRT) display, for example. The input devices may be used to input data, such as selecting signal lines displayed on the display device 1.

The storage device 18 stores various kinds of data, such as properties of the PCB layout design, for example. The properties of the PCB layout design may include, but are not limited to, a plurality of signal lines that belong to the PCB layout design. The storage device 18 further stores properties of each of the plurality of signal lines. In one embodiment, the properties of a signal line may include: coordinates of two ends of each signal line, an identifier (ID) of each signal line, adjacent lines of each signal line, and a width of each signal line. The signal line may be a micro-strip line or a strip line in the PCB layout design. In one embodiment, the storage device 18 may be an external storage device 18 (e.g., a moveable disk) or a memory of the computer 10, such as a hard disk, for example.

Figure 4:
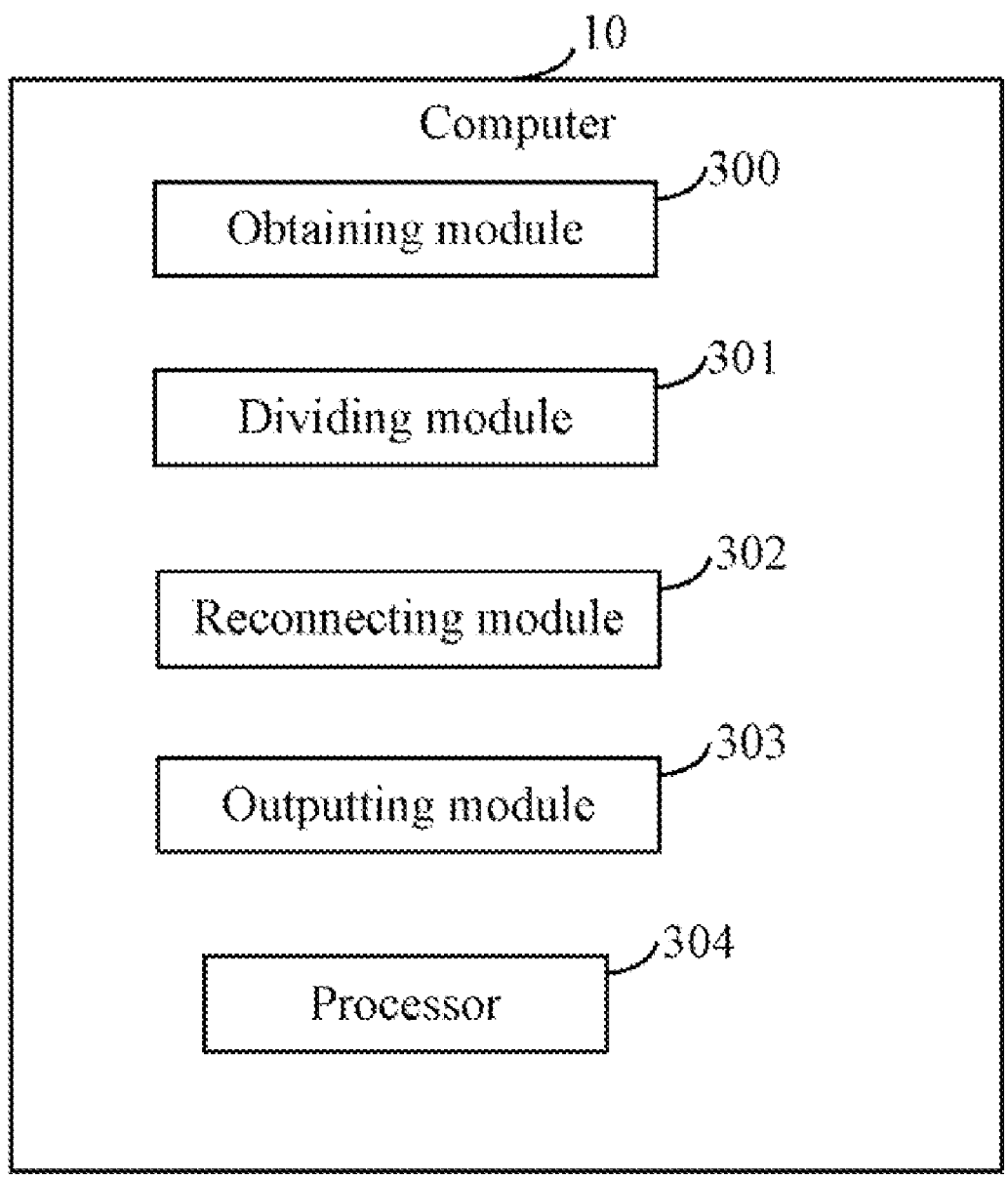
FIG. 4 is a block diagram of one embodiment of the computer of FIG. 3.

FIG. 4 is a block diagram of one embodiment of the computer 10 of FIG. 3. In one embodiment, the computer 10 includes an obtaining module 300, a dividing module 301, a reconnecting module 302, an outputting module 303, and a processor 304. In one embodiment, the modules 300-303 comprise one or more computerized codes that are stored in the storage device 18. The processor 304 of the computer 10 executes the computerized instructions to implement one or more operations of the computer 10.

Figure 1:
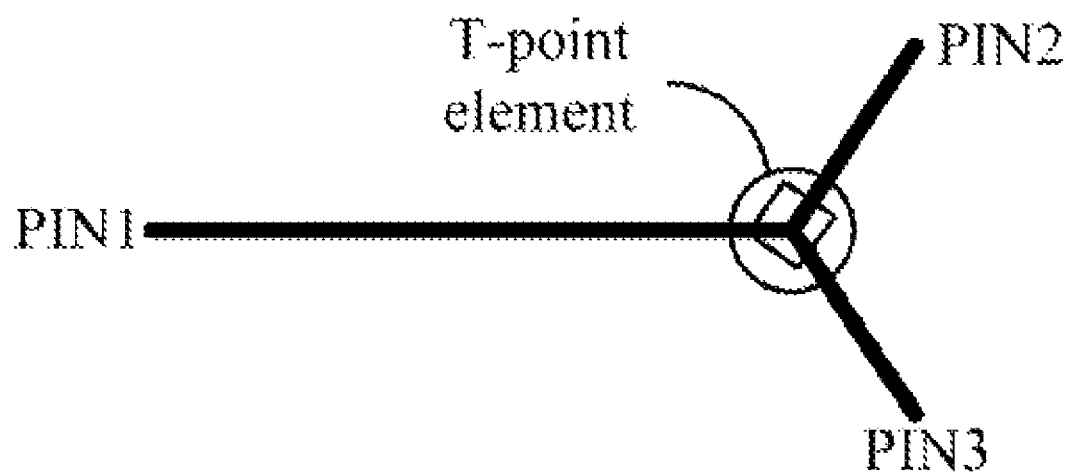
FIG. 1 is a schematic diagram of one embodiment of a T-point element in a printed circuit board (PCB) layout design.
Figure 2:
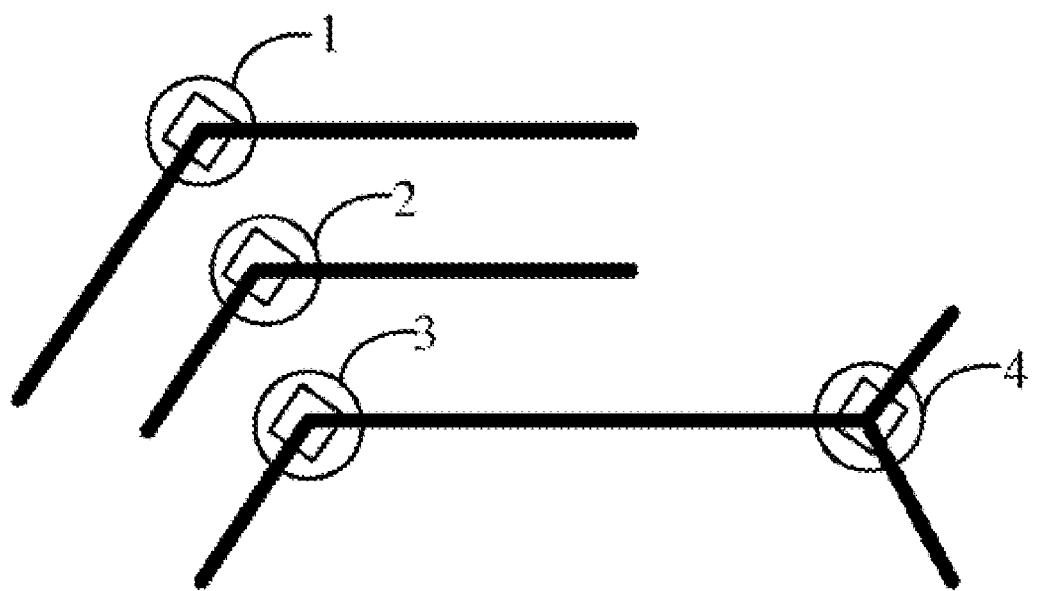
FIG. 2 is a schematic diagram of one embodiment of T-point elements with unused stubs in the PCB layout design.

The obtaining module 300 obtains each signal line of a PCB layout design from the storage device 18, the obtained signal line includes one or more T-point elements with unused stubs. In one embodiment, a T-point element is determined as a T-point element with unused stub if the T-point element connects only two lines (referring to T-point elements 1, 2, and 3 in FIG. 2). Otherwise, if a T-point element connects at least three lines, the T-point element is determined as a useful T-point element. For example, as shown in FIG. 2, because a T-point element 4 connects three lines, the T-point element 4 is determined as the useful T-point element.

The dividing module 301 divides the obtained signal line into a plurality of lines according to the one or more T-point elements with unused stubs, and obtains properties of each of the plurality of lines without properties of the T-point elements with unused stubs. In one embodiment, the properties of each of the plurality of lines may include: coordinates of two ends of each of the plurality of lines, an identifier (ID) of each of the plurality of lines, adjacent lines of each of the plurality of lines, and a width of each of the plurality of lines.

Figure 6:
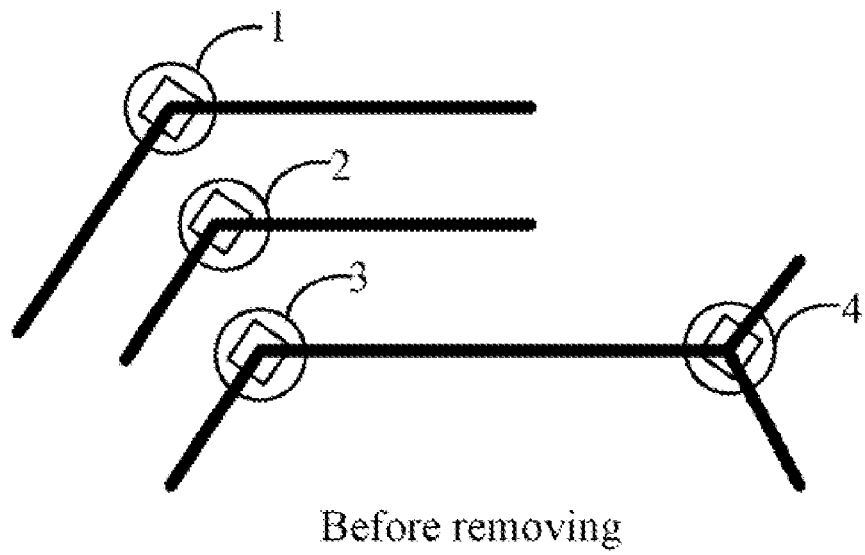
FIG. 6 is a schematic diagram of the PCB layouts before and after removing T-point elements with unused stubs.
Figure 6:
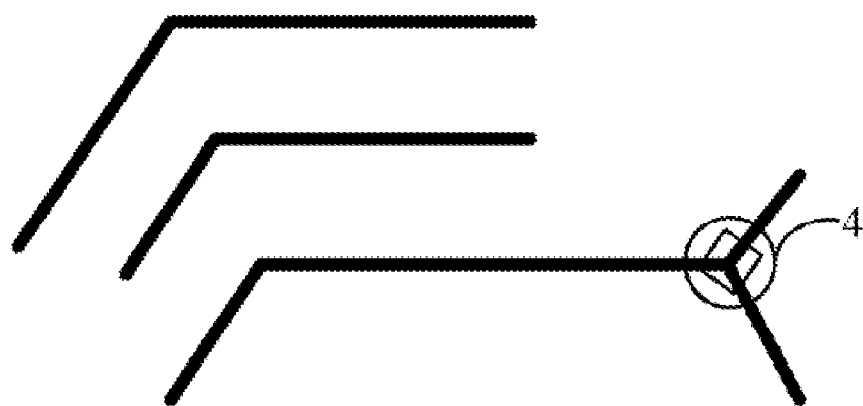

The reconnecting module 302 deletes the original layout of each signal line comprising one or more T-point elements with unused stubs, reconnects the plurality of lines according to the properties of each of the plurality of lines, and generates a reconnected signal line, thereby removing the one or more T-point elements with unused stubs in the obtained signal line. An example of the PCB layout after removing the T-point elements with unused stubs is shown in FIG. 6. In FIG. 6, the T-point elements with unused stubs 1, 2, and 3 are removed, and the useful T-point element 4 is reserved.

The outputting module 303 outputs the reconnected signal line on the display device 16.

Figure 5:
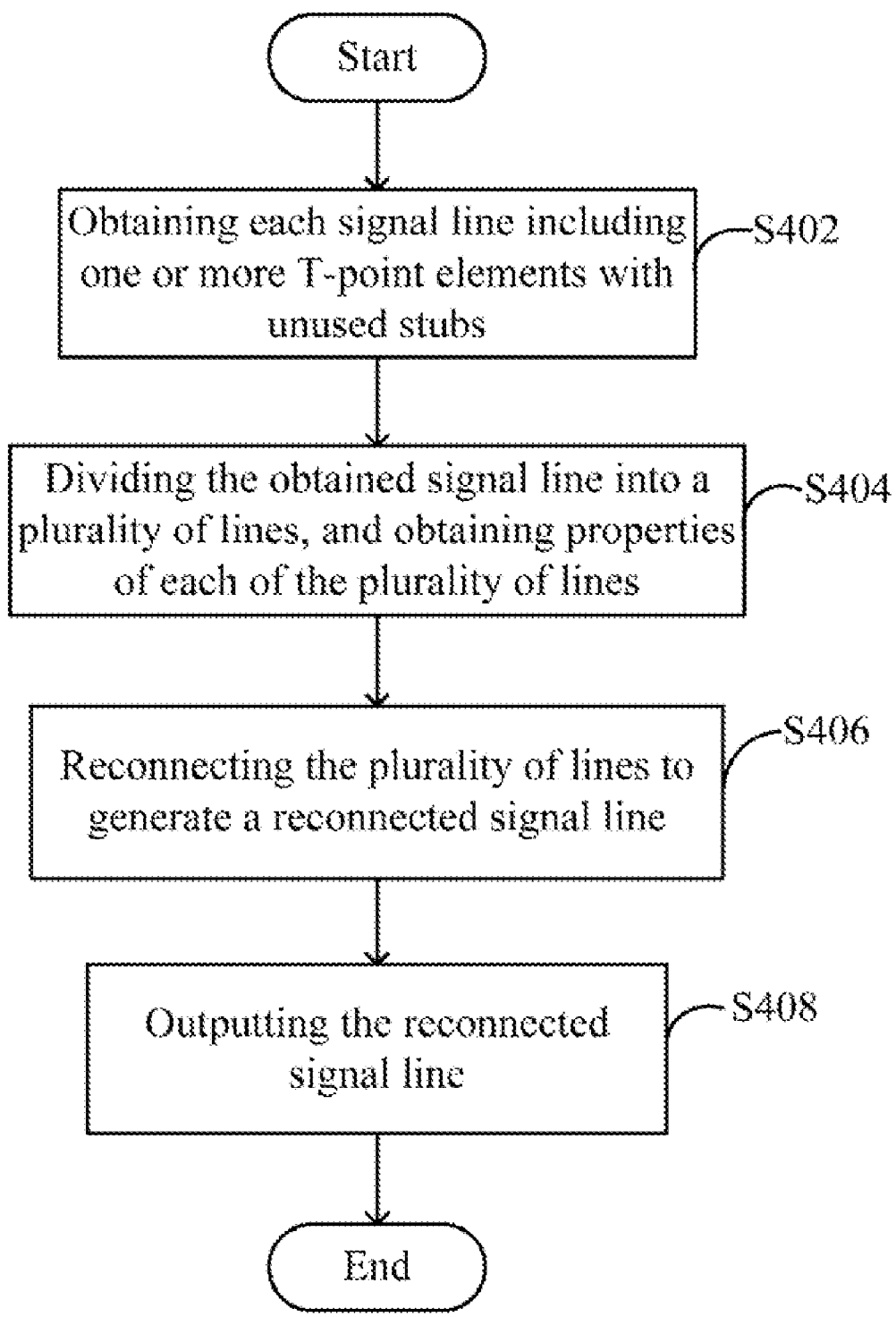
FIG. 5 is a flowchart of one embodiment of a method for removing T-point elements with unused stubs from the PCB layout design using software of the computer of FIG. 3.

FIG. 5 is a flowchart of one embodiment of a method for removing T-point elements with unused stubs from the PCB layout design using software of the computer 10.

In block S402, the obtaining module 300 obtains each signal line of a PCB layout design from the storage device 18, the obtained signal line includes one or more T-point elements with unused stubs. Detailed descriptions are as follows. Firstly, the obtaining module 300 obtains properties of the PCB layout design from the storage device 18, the properties of the PCB layout design may include each signal line that belongs to the PCB layout design. Secondly, the obtaining module 300 obtains each signal line including one or more T-point elements with unused stubs in the PCB layout design sequentially.

In block S404, the dividing module 301 divides the obtained signal line into a plurality of lines according to the one or more T-point elements with unused stubs, and obtains properties of each of the plurality of lines without properties of the T-point elements with unused stubs. In one embodiment, the properties of each of the plurality of lines may include: coordinates of two ends of each of the plurality of lines, an identifier (ID) of each of the plurality of lines, adjacent lines of each of the plurality of lines, and a width of each of the plurality of lines.

In block S406, the reconnecting module 302 deletes the original layout design of each signal line including one or more T-point elements with unused stubs, reconnects the plurality of lines according to the properties of each of the plurality of lines, and generates a reconnected signal line, thereby removing the one or more T-point elements with unused stubs in the obtained signal line.

In block S408, the outputting module 303 outputs the reconnected signal line on the display device 16.

It should be emphasized that the above-described embodiments of the present disclosure, particularly, any embodiments, are merely possible examples of implementations, merely set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure and the present disclosure and protected by the following claims.

What is claimed is:

1. A computer-implemented method for removing T-point elements with unused stubs from a printed circuit board (PCB) layout design using software of a computer, the method comprising:
    (a) obtaining each signal line of the PCB layout design from a storage device of the computer, wherein each said obtained signal line comprises one or more T-point elements with unused stubs;
    (b) dividing each said obtained signal line into a plurality of lines according to the one or more T-point elements with unused stubs, and obtaining properties of each of the plurality of lines without properties of the T-point elements with unused stubs;
    (c) deleting, in the PCB layout design, each signal line comprising one or more T-point elements with unused stubs and reconnecting the plurality of lines according to the properties of each of the plurality of lines, and generating a reconnected signal line thereby removing the one or more T-point elements with unused stubs in each said obtained signal line; and
    (d) outputting the reconnected signal line on a display device of the computer.

2. The method according to claim 1, wherein each of the one or more T-point elements with unused stubs connects two lines.

3. The method according to claim 1, wherein the properties of each of the plurality of lines comprise: coordinates of two ends of each of the plurality of lines, an identifier (ID) of each of the plurality of lines, adjacent lines of each of the plurality of lines, and a width of each of the plurality of lines.

4. The method according to claim 1, wherein the signal line comprises a micro-strip line or a strip line.

5. The method according to claim 1, further comprising:
    obtaining properties of the PCB layout design from the storage device, the properties of the PCB layout design comprising each signal line that belongs to the PCB layout design.

6. A storage medium having stored thereon instructions that, when executed by a processor of a computer, causes the processor to perform a method for removing T-point elements with unused stubs from a printed circuit board (PCB) layout design using software of a computer, the method comprising:
    (a) obtaining each signal line of the PCB layout design from a storage device of the computer, wherein each said obtained signal line comprises one or more T-point elements with unused stubs;
    (b) dividing each said obtained signal line into a plurality of lines according to the one or more T-point elements with unused stubs, and obtaining properties of each of the plurality of lines without properties of the T-point elements with unused stubs;
    (c) deleting, in the PCB layout design, each signal line comprising one or more T-point elements with unused stubs and reconnecting the plurality of lines according to the properties of each of the plurality of lines, and generating a reconnected signal line thereby removing the one or more T-point elements with unused stubs in each said obtained signal line; and
    (d) outputting the reconnected signal line on a display device of the computer.

7. The storage medium according to claim 6, wherein each of the one or more T-point elements with unused stubs connects two lines.

8. The storage medium according to claim 6, wherein the properties of each of the plurality of lines comprise: coordinates of two ends of each of the plurality of lines, an identifier (ID) of each of the plurality of lines, adjacent lines of each of the plurality of lines, and a width of each of the plurality of lines.

9. The storage medium according to claim 6, wherein the signal line comprises a micro-strip line or a strip line.

10. The storage medium according to claim 6, further comprising: obtaining properties of the PCB layout design from the storage device, the properties of the PCB layout design comprising each signal line that belongs to the PCB layout design.

11. The storage medium according to claim 6, wherein the storage medium is selected from the group consisting of a hard disk drive, a compact disc, a digital video disc, and a tape drive.

12. A computing system for removing T-point elements with unused stubs from a printed circuit board (PCB) layout design using software of a computer, comprising:
    a storage device;
    at least one processor; and
    one or more programs stored in the storage device and being executable by the at least one processor, the one or more programs comprising:
    an obtaining module operable to obtain each signal line of the PCB layout design from the storage device, wherein each said obtained signal line comprises one or more T-point elements with unused stubs;
    a dividing module operable to divide each said obtained signal line into a plurality of lines according to the one or more T-point elements with unused stubs, and obtain properties of each of the plurality of lines without properties of the T-point elements with unused stubs;

a reconnecting module operable to delete, in the PCB layout design, each signal line comprising one or more T-point elements with unused stubs and reconnect the plurality of lines according to the properties of each of the plurality of lines, and generate a reconnected signal line thereby removing the one or more T-point elements with unused stubs in each said obtained signal line; and an outputting module operable to output the reconnected signal line on a display device of the computer.

13. The system according to claim 12, wherein each of the one or more T-point elements with unused stubs connects two lines.

14. The system according to claim 12, wherein the properties of each of the plurality of lines comprise: coordinates of two ends of each of the plurality of lines, an identifier (ID) of each of the plurality of lines, adjacent lines of each of the plurality of lines, and a width of each of the plurality of lines.

15. The system according to claim 12, wherein the signal line comprises a micro-strip line or a strip line.

* * * * *